United States Patent
Tailliet et al.

(10) Patent No.: US 10,732,894 B2
(45) Date of Patent: Aug. 4, 2020

(54) METHOD OF WRITING IN A NON-VOLATILE MEMORY DEVICE AND CORRESPONDING NON-VOLATILE MEMORY DEVICE

(71) Applicant: STMicroelectronics (Rousset) SAS, Rousset (FR)

(72) Inventors: François Tailliet, Fuveau (FR); Marc Battista, Allauch (FR)

(73) Assignee: STMICROELECTRONICS (ROUSSET) SAS, Rousset (FR)

( * ) Notice: Subject to any disclaimer, the term of this patent is extended or adjusted under 35 U.S.C. 154(b) by 278 days.

(21) Appl. No.: 15/900,481

(22) Filed: Feb. 20, 2018

(65) Prior Publication Data
US 2018/0300085 A1 Oct. 18, 2018

(30) Foreign Application Priority Data

Apr. 12, 2017 (FR) ..................... 17 53213

(51) Int. Cl.
| G11C 29/00 | (2006.01) |
| G06F 3/06 | (2006.01) |
| G06F 11/10 | (2006.01) |
| G11C 29/52 | (2006.01) |
| G06F 12/02 | (2006.01) |

(52) U.S. Cl.
CPC .......... G06F 3/0659 (2013.01); G06F 3/0604 (2013.01); G06F 3/064 (2013.01); G06F 3/0679 (2013.01); G06F 11/1068 (2013.01); G06F 12/0246 (2013.01); G11C 29/52 (2013.01)

(58) Field of Classification Search
CPC ............ G06F 11/1068; G06F 12/0246; G06F 3/0604; G06F 3/064; G06F 3/0659; G06F 3/0679; G06F 11/10; G06F 12/00; G06F 12/02; G06F 12/08; G06F 17/30; G11C 29/52; G11C 16/20; G11C 16/3445
See application file for complete search history.

(56) References Cited

U.S. PATENT DOCUMENTS

| 4,817,095 A * | 3/1989 | Smelser .............. G06F 11/1056 |
|  |  | 362/201 |
| 8,832,539 B1 * | 9/2014 | Patil ..................... G06F 11/1068 |
|  |  | 707/697 |
| 2002/0083262 A1 * | 6/2002 | Fukuzumi ............. G06F 3/0626 |
|  |  | 711/103 |
| 2004/0114431 A1 * | 6/2004 | Shona .................. G11C 16/102 |
|  |  | 365/185.11 |
| 2009/0024787 A1 * | 1/2009 | Yim .................... G06F 12/0246 |
|  |  | 711/103 |

(Continued)

FOREIGN PATENT DOCUMENTS

EP 2367100 A2 9/2011

Primary Examiner — Albert Decady
Assistant Examiner — Enamul M Kabir
(74) Attorney, Agent, or Firm — Slater Matsil, LLP (57) ABSTRACT

A method of writing in a memory of the EEPROM type includes, in the presence of a string of new bytes to be written in the memory plane in at least one destination memory word already containing old bytes, a verification for each destination memory word whether or not the old bytes of this destination memory word must all be replaced with new bytes. The method also includes a reading of the old bytes of this destination memory word only if the old bytes must not all be replaced with new bytes.

22 Claims, 5 Drawing Sheets

(56) References Cited

U.S. PATENT DOCUMENTS

| | | | |
|---|---|---|---|
| 2009/0113272 A1* | 4/2009 | Tan | G06F 11/1052 |
| | | | 714/765 |
| 2011/0029724 A1* | 2/2011 | Conley | G06F 12/0246 |
| | | | 711/103 |
| 2012/0254549 A1* | 10/2012 | Hutchison | G06F 12/0246 |
| | | | 711/136 |
| 2015/0254176 A1* | 9/2015 | Boursier | G11C 16/349 |
| | | | 711/103 |
| 2016/0027481 A1* | 1/2016 | Hong | G06F 12/0246 |
| | | | 714/807 |
| 2016/0217030 A1* | 7/2016 | Shin | G06F 11/085 |
| 2016/0378820 A1* | 12/2016 | Marcotte | G06F 16/183 |
| | | | 707/703 |

\* cited by examiner

METHOD OF WRITING IN A NON-VOLATILE MEMORY DEVICE AND CORRESPONDING NON-VOLATILE MEMORY DEVICE

CROSS-REFERENCE TO RELATED APPLICATIONS

This application claims priority to French Application No. 1753213, filed on Apr. 12, 2017, which application is hereby incorporated herein by reference.

TECHNICAL FIELD

Embodiments and modes of implementation relate to integrated circuits and particular embodiments relate to non-volatile memories using an error-correcting code.

BACKGROUND

Non-volatile memories using an error-correcting code ECC may be, for example, flash-NOR, flash-NAND, or EEPROM (electrically erasable and programmable) memories.

A non-volatile memory customarily comprises a memory plane, arranged in matrix fashion in rows and columns. Memory cells (or memory locations) are grouped into memory words and are capable of storing in a non-volatile manner a digital datum (otherwise called a bit) by charge retention in the floating gate of a floating-gate transistor.

Injections and extractions of charge in the floating gates by the Fowler-Nordheim effect make it possible to erase and to program the memory cells electrically.

In EEPROM memories, the memory words frequently comprise a byte. In EEPROM memories, the memory words frequently comprise a byte. In approaches using error-correcting codes, for example, for high-density EEPROM memories, the memory words can comprise several bytes, typically four, and a series of parity bits. Error-correcting codes such as a Hamming code make it possible to calculate the parity bits and to correct a possible error among the bytes or the parity bits of a memory word.

The writing of a digital datum in such a memory cell generally comprises a step of erasure followed by a step of programming of all the memory cells of one and the same memory word, or sometimes solely an erasure or programming step, as a function of the data to be written.

Memories of EEPROM type consequently have an internal granularity of the size of a memory word, but generally accept commands whose granularity is one single byte, so as to meet usage needs. The term granularity designates the smallest materially accessible unit of saved digital data.

Consequently, upon a command to write a size less than the internal granularity of the memory, it is necessary to recompose the data to be written with the old data stored in the memory plane so as to correspond to the internal granularity before implementing a cycle of writing at least one whole memory word. This recomposition comprises taking into account the new data to be written and the old data of the corresponding memory word which are stored in the memory plane, and requires a reading operation.

Generally, a memory of EEPROM type can, in a single write cycle, write at most a whole page comprising a number of bytes dependent on the size of the memory. For example, in a 16 Kbit memory, a page takes 16 bytes and it is possible to write from 1 to 16 bytes in a cycle, and, in a 4 Mbit memory, a page takes 512 bytes and it is possible to write from 1 to 512 bytes in a cycle.

Figure 1:
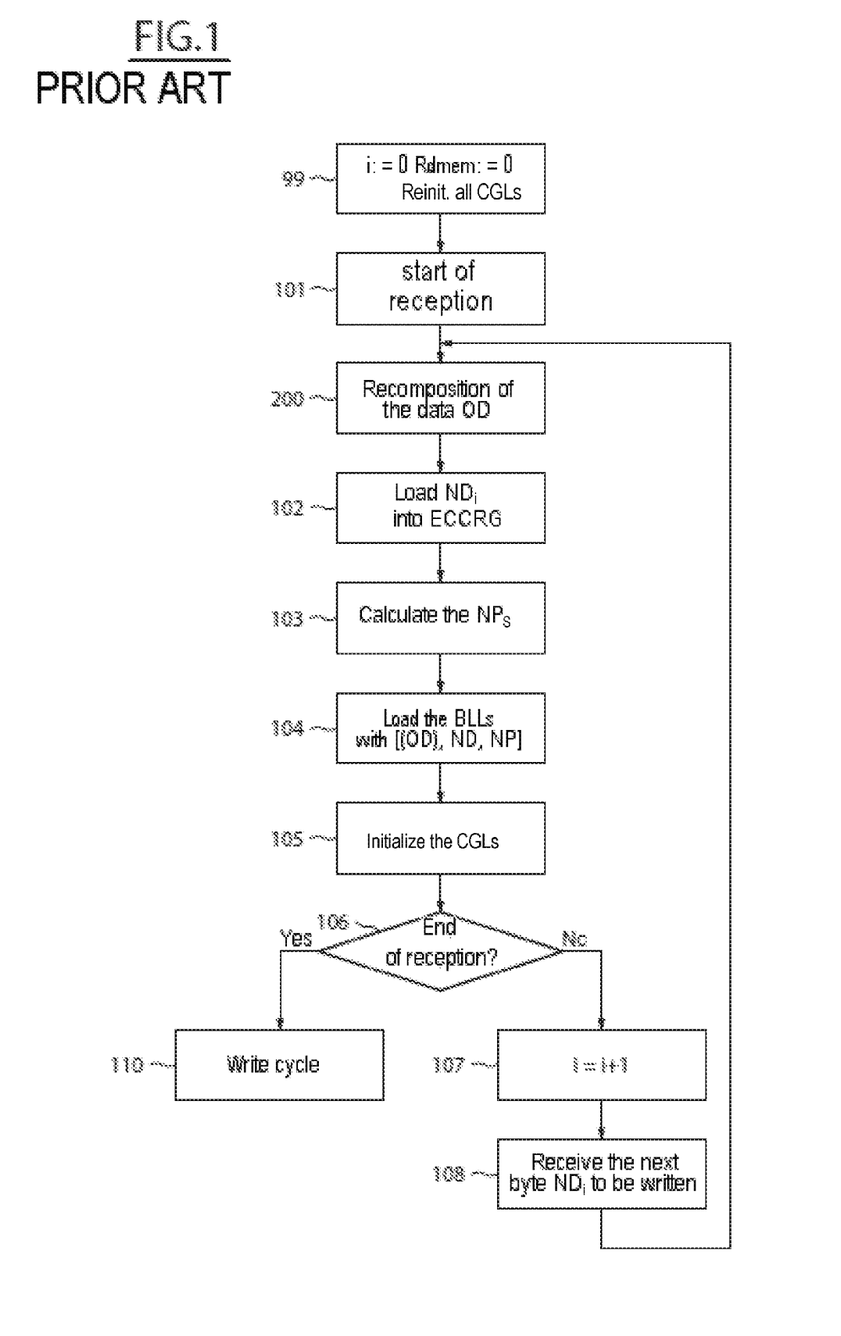
FIGS. 1 and 2 represent a mode of implementation of a customary method of writing.

FIG. 1 represents steps implemented during a customary writing of a memory of EEPROM type.

A preliminary step 99 corresponds to initializations of internal variables (i:=0, Rdmem:=0) and to a reinitialization of all the control gate latches CGL.

Step 101 corresponds to a start of reception of a write command and comprises a reception of a first byte NDi (i=0) to be written.

During the reception of the byte NDi (that is to say for a duration of eight clock ticks), a step of data recomposition 200 is systematically implemented. This step 200 corresponds to a reading of the old data stored in the memory plane, their possible correction, and their loading into an intermediate register ECCRG.

Figure 2:
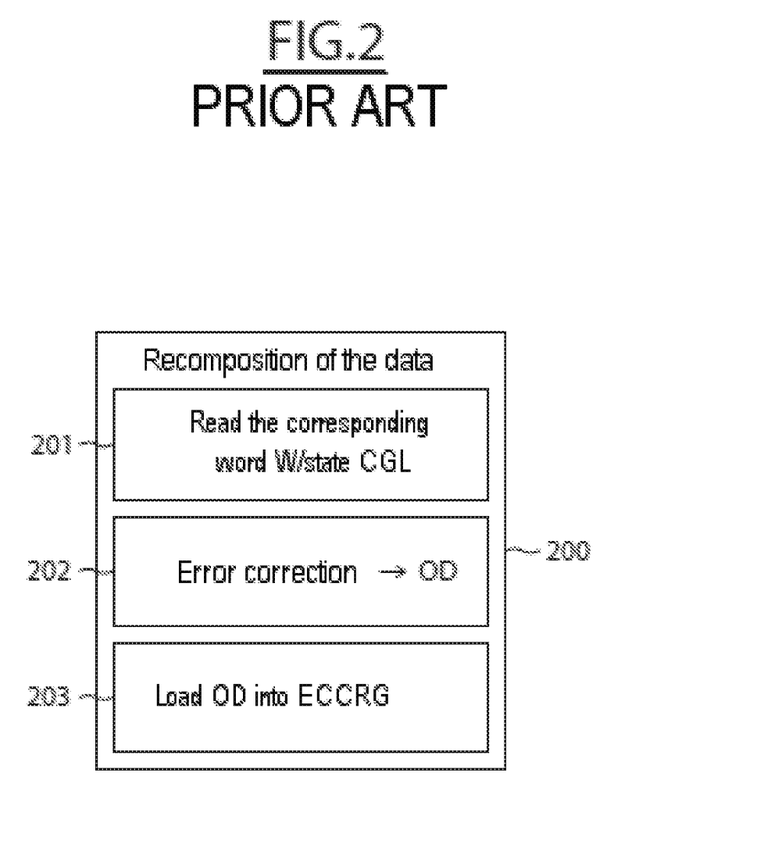

More precisely, and as represented by FIG. 2, the step of recomposing the data 200 comprises a reading 201 of the memory word in which the new data NDi are intended to be written. This reading 201 is done on the basis of the memory plane if the corresponding control gate latch CGL is reinitialized, otherwise on the basis of bit line latches BLL if the corresponding control gate latch CGL is initialized (see step 105). ("Reinitialization" and "initialization" are customarily designated by the respective terms "reset" and "set", corresponding here to logical codes, for example, "0" and "1" respectively). The data read are loaded into the register ECCRG.

A correction 202 of a possible error is implemented by virtue of a mechanism of the Hamming code type. The data OD thus read and possibly corrected are thereafter loaded 203 into the intermediate register ECCRG.

This intermediate register ECCRG serves as output storage stage for the error correction logic, and as input for the bit line latches.

The architecture of the intermediate register ECCRG is analogous to a memory word architecture, that is to say that it comprises, for example, 4 bytes intended to receive data and a series of parity bits.

After the complete reception of the byte NDi (that is to say after the eight clock ticks), in the following step 102, the new byte NDi is loaded into the intermediate register ECCRG, by overwriting one of the four bytes OD of the register ECCRG.

A calculation of the new parity bits NP corresponding to the combination of the old data OD and of the new byte NDi is then implemented in a step 103.

The following step 104, consists in loading the bit line latches BLL with the data loaded in the intermediate register ECCRG.

Step 104 is followed by a step 105 of initialization of control gate latch CGL, representative of a loaded or unloaded state of the bit line latches BLL of the corresponding memory word. When the control gate latch of a memory word is initialized, the next reading of this memory word is done in the bit line latches and not in the memory plane.

These steps 104, 105 form part of a preliminary phase of a write cycle no in the course of which high-voltage pulses are applied in the memory cells so as to erase them and/or to program them according to the data contained in the bit line latches.

A test of end of reception 106 is carried out and, as long as the last byte has not been received and loaded into the corresponding bit line latches, steps 101 to 106 and 200 are repeated with the following consecutive bytes (107, 108).

When all the bytes to be written have been received, processed and loaded into the bit line latches, then the cycle of writing in the memory plane no is implemented during a common phase for all the data loaded in the bit line latches.

This type of conventional implementation exhibits the major drawback of being very expensive in terms of energy resources.

Indeed, this type of implementation comprises an unconditional reading operation for each byte to be written. This introduces non-negligible energy consumption.

Indeed, a majority of the energy consumption originates from the reading operations, each drawing a current of the order of 1.5 mA for a typical duration of 2 clock cycles (i.e., 5 μs at 400 kHz).

Consequently, for a write of 256 bytes, 256 reading operations, 256 error corrections and 256 calculations of parity bits are implemented. This corresponds to a consumption of a current of the order of 1.5 mA for an aggregate duration of 1.3 ms.

This energy expenditure is of the same order of magnitude as the energy expended during the cycle of writing in the memory plane.

SUMMARY

Embodiments of the present invention can limit the current consumption discussed above.

In this regard, there is proposed a method of writing according to a first granularity in a memory plane of a non-volatile memory. The memory plane is arranged as memory words, each of which is intended to store more than one byte of data and the memory is configured to access the memory plane according to a second granularity greater than the first granularity. The method of writing comprises, in the presence of a string of new bytes to be written in the memory plane in at least one destination memory word already containing old bytes, a verification for each destination memory word whether or not the old bytes of this destination memory word must all be replaced with new bytes. If at least one old byte must not be replaced with a new byte, each old byte not having to be replaced is read and loaded into an intermediate register that stores the new bytes and the at least one old byte, thereby forming a new content of the destination memory word. If all the old bytes of this destination memory word must be replaced with new bytes, the new bytes are loaded into an intermediate register to form the new content of the destination memory word, without any prior operation of reading of the old bytes of this destination memory word. A cycle of writing in the memory plane of the new content of each destination memory word can then be performed.

The term "first granularity" corresponds here to the smallest unit of data that a user can dispatch in writing to the memory, otherwise called "user granularity" or "client granularity." The term "second granularity" corresponds here to the smallest unit of data that the non-volatile memory is capable, on account of its design, of writing in the memory plane, otherwise called "physical granularity" or "internal granularity."

For example, the first granularity can be one byte and the second granularity can be one memory word. A memory word comprises, for example, four bytes.

Thus, during a writing operation, it is possible for the memory to have to read the old data of a memory word, so as to rewrite them, in the case where the string of new bytes to be written does not correspond to at least one complete memory word (stated otherwise to the physical granularity of the memory).

In the conventional operations, this reading of the old data is carried out systematically, while in the method according to this aspect, an operation of reading the old bytes is implemented during a writing of new bytes only when necessary (when rewriting these same old bytes or when calculating new parity bits), that is to say when the old bytes of the destination memory word must not all be replaced with new bytes.

The verification can advantageously comprise an identification of the respective locations of the first new byte to be written in the corresponding destination memory word and of the last new byte to be written in the corresponding destination memory word, locations respectively identical to that assigned to the first byte of the corresponding destination memory word and to that assigned to the last byte of the corresponding destination memory word implying that the old bytes of this destination memory word must all be replaced with new bytes.

This mode of implementation indeed makes it possible to verify in a simple and effective manner whether or not the old bytes of the destination memory word or words must all be replaced with new bytes.

Advantageously, the identification of the location of the first new byte comprises a logical test between the values of the last two low-order bits of the address of the location of the first new byte and the values 0-0, equality between these values signifying that the location of this first new byte corresponds to that assigned to the first byte of the corresponding destination memory word, and the identification of the location of the last new byte comprises a logical test between the values of the last two low-order bits of the address of the location of the last new byte and the values 1-1, equality between these values signifying that the location of this last new byte corresponds to that assigned to the last byte of the corresponding destination memory word.

This mode of implementation is suitable for a memory word architecture comprising four bytes of data, the values of the last two low-order bits of the addresses of the first and of the last byte of an arbitrary memory word of the memory plane always being respectively 0-0 and 1-1.

According to one mode of implementation in which a series of parity bits is associated with each memory word of the memory plane, the loadings into the intermediate register of the new content of the destination memory word each comprise a respective calculation of new parity bits associated with and on the basis of this new content of each destination memory word.

Advantageously, the calculations of new parity bits are implemented on the basis of the new bytes and, if appropriate, of the old bytes, previously loaded in the intermediate register.

Advantageously, the operation of reading the at least one old byte comprises a correction of a possible error present in the at least one old byte.

Indeed, the method according to this aspect makes it possible to economize on reading energy when the internal granularity of the memory is greater than the user granularity, and in particular in the presence of an error-correcting code mechanism.

According to one mode of implementation, the write cycle comprises a loading of the bytes loaded in the intermediate register, and if appropriate, of the new parity bits, in corresponding bit line latches, and a writing in the memory plane of the data loaded in the bit line latches.

According to another aspect, a non-volatile memory device comprises an input for receiving data to be written according to a first granularity, a memory plane arranged as memory words each intended to store more than one byte of data in memory locations. The device also comprises a read circuit and a write circuit, which are configured to carry out, according to a second granularity greater than the first granularity, respectively reading operations and write cycles in the memory plane. A controller is configured to, in the presence of a string of new bytes to be written in the memory plane in at least one destination memory word already containing old bytes, verify for each destination memory word whether or not the old bytes of this destination memory word must all be replaced with new bytes. If at least one old byte must not be replaced with a new byte, the controller will command the read circuit to carry out an operation of reading each old byte not having to be replaced and will command a loading into an intermediate register of each new byte and of the at least one old byte, thereby forming a new content of the destination memory word. If the old bytes of this destination memory word must all be replaced with new bytes, the controller will command a loading into an intermediate register of each new byte, forming the new content of the destination memory word without commanding prior operation of reading of the old bytes of this destination memory word. The controller will also command the write circuit to carry out a cycle of writing of the new content of each destination memory word.

For example, the first granularity can be one byte and the second granularity can be one memory word. A memory word comprises, for example, four bytes.

According to one embodiment, the controller is configured to, during the verification, identify the respective locations of the first new byte to be written in the corresponding destination memory word and of the last new byte to be written in the corresponding destination memory word, locations respectively identical to that assigned to the first byte of the corresponding destination memory word and to that assigned to the last byte of the corresponding destination memory word implying that the old bytes of this destination memory word must all be replaced with new bytes.

Advantageously, the controller is configured to carry out a logical test between the values of the last two low-order bits of the address of the location of the first new byte and the values 0-0, equality between these values signifying that the location of this first new byte corresponds to that assigned to the first byte of the corresponding destination memory word, and a logical test between the values of the last two low-order bits of the address of the location of the last new byte and the values 1-1, equality between these values signifying that the location of this last new byte corresponds to that assigned to the last byte of the corresponding destination memory word.

According to one embodiment, in which the memory plane comprises memory locations intended to store a series of parity bits associated with each memory word, the device comprises an error correction circuit configured to calculate new parity bits associated with and on the basis of this new content of each destination memory word.

According to one embodiment, the read circuit is configured to carry out reading operations comprising a reading in the memory plane and the error correction circuit to correct a possible error present in the memory words read.

According to one embodiment, the controller is configured to further command the read circuit, the write circuit and, if appropriate, the error correction circuit, after reception of the last byte of the string of new bytes to be written.

According to one embodiment, the write circuit is configured to, during a write cycle, load the new content of each destination memory word loaded in the intermediate register and, if appropriate, the new parity bits in bit line latches, and write the data loaded in the bit line latches in the memory plane.

The device is advantageously embodied in an integrated manner, for example, within a system on chip.

There is furthermore proposed an electronic apparatus, such as an auditory prosthesis or a mobile telephone, comprising a device or a system on chip such as defined hereinabove.

BRIEF DESCRIPTION OF THE DRAWINGS

Other advantages and characteristics of the invention will be apparent on examining the detailed description of wholly non-limiting embodiments and modes of implementation, and the appended drawings in which.

DETAILED DESCRIPTION OF ILLUSTRATIVE EMBODIMENTS

Figure 3:
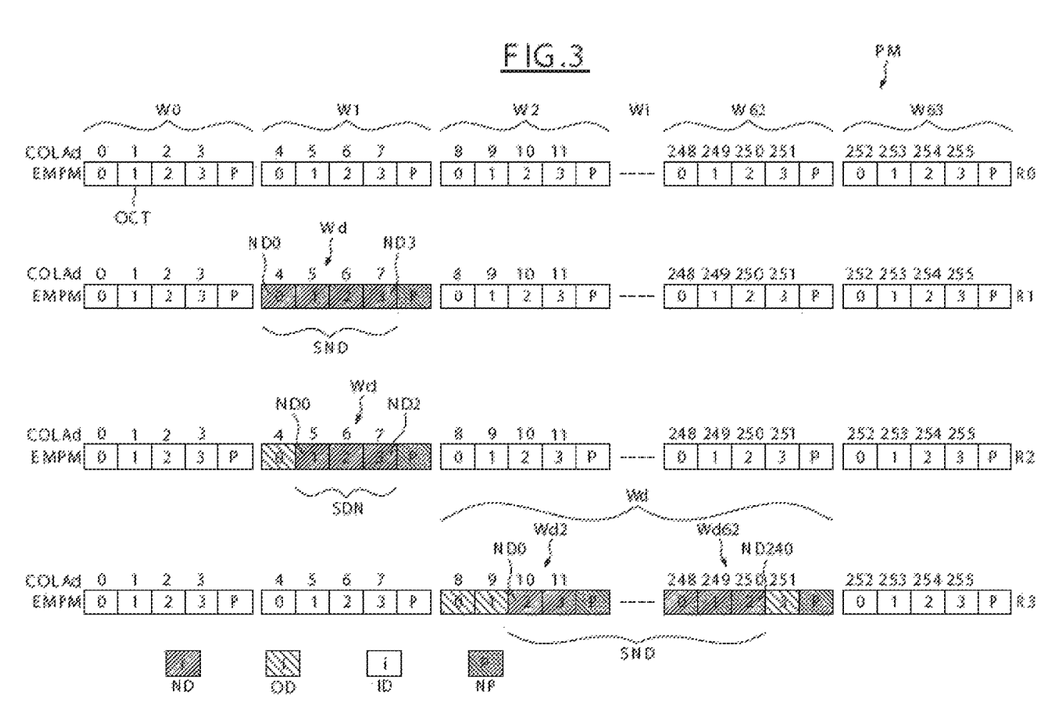
FIGS. 3 to 6 represent examples of embodiments and of modes of implementation of the invention.

FIG. 3 schematically represents a portion of memory plane PM arranged in matrix fashion according to rows R0-R3 and columns COLAd 0-255.

Memory locations EMPM are organized within a row as memory words W0-W63 each comprising 4 bytes of data OCT and a series of 6 parity bits P. On the basis of the parity bits, a corrector code of the Hamming code type is able to correct an error in the 38 bits of the corresponding memory word Wi.

The internal granularity of the memory is therefore 38 bits while the external granularity is 1 byte (8 bits).

The size of a physical page in this example is 256 bytes, consequently from 1 to 256 bytes can be written in a single write cycle.

The address of the first byte to be written is dispatched to the memory and the bytes to be written are thereafter dispatched sequentially. An address register is automatically incremented on completion of the processing of each byte.

The high-order bits of the transmitted address make it possible to identify the row of the corresponding memory location EMPM, and the low-order bits of this address make it possible to identify the column of the memory location EMPM of the first byte to be written.

The last address corresponds to the address present in the address counter when all the bytes to be written have been dispatched, and before the chip is deselected by a STOP condition of the protocol used.

A string of new bytes to be written does not systematically agree with a given number of groups of 4 bytes. This depends on the address of the first byte to be written and on the number of bytes in the string to be written.

Each new byte is intended to be written in a memory word, termed the destination memory word.

The three rows R1, R2, R3 represented by FIG. 3 each correspond to an independent example of a string of new bytes SND to be written.

The rows R1, R2, R3 represent the final content obtained for the various examples, with NDi the new bytes of a destination memory word Wd, i designating the position of this byte in the string SND, with ND0 the first byte of the string SND. In a similar manner OD designates the old bytes of a destination memory word and ID the bytes of the memory plane that are not affected by the write. The new parity bits associated with each destination memory word are designated by the reference NP.

In the first example represented in the row R1, the string of new bytes to be written SND comprises 4 bytes from column 4 to column 7. The first new byte ND0 corresponds to the first byte of the destination memory word Wd, the following new bytes are transmitted sequentially and have the following consecutive addresses, until the last new byte received ND3. The last new byte ND3 corresponds to the last byte of the destination memory word Wd.

In this first case, the calculation of the new parity bits NP associated with this destination memory word Wd must take into account only the new bytes ND0, ND1, ND2, ND3, consequently it is not necessary to carry out operations of reading of the old bytes of this destination memory word Wd.

In the second example represented in the row R2, the string of new bytes to be written SND comprises 3 bytes from column 5 to column 7. The first new byte ND0 does not correspond to the first byte of the destination memory word Wd, the following bytes are transmitted sequentially and have consecutive addresses, until the last new byte received ND2 corresponding to the last byte of the destination memory word Wd.

In this second case, the calculation of the new parity bits NP associated with this destination memory word Wd must take into account the old byte OD0 and the new bytes ND0, ND1, ND2. Consequently, an operation of reading of the old byte OD0 of this destination memory word Wd is necessary.

In the third example represented by the row R3, the string of new bytes to be written SND comprises 241 new bytes, from column 10 to column 250. The string of new bytes covers in this third example 61 destination memory words Wd, referenced Wd2 to Wd62. The first new byte ND0 does not correspond to the first byte of the corresponding destination memory word Wd2, the following bytes are transmitted sequentially and have consecutive addresses, until the last new byte received ND240. The last new byte ND240 does not correspond to the last byte of the corresponding destination memory word Wd62.

In this third case, the calculation of the new parity bits NP associated with the first destination memory word Wd2 must take into account the old bytes OD0, OD1 of the first destination memory word Wd2 and the new bytes ND0, ND1. The calculation of the new parity bits NP associated with the last destination memory word Wd62 must take into account the old byte OD3 of this destination memory word Wd62 and the new bytes ND238, ND239, ND240. Each of the other destination memory words Wd3-Wd61 corresponds to the case of the first example, and the calculation of the parity bits associated with these other destination memory words must take into account only the new bytes.

Consequently, it is necessary to carry out an operation of reading of the old bytes OD0, OD1 of the first destination memory word Wd2 and of the old byte OD3 of the last destination memory word Wd62.

The method of writing, an exemplary implementation of which is given hereinafter in conjunction with FIG. 4, makes it possible to carry out only the reading operations necessary for the calculations of the new parity bits.

More precisely, if at least one old byte OD must not be replaced with a new byte ND, the method of writing comprises an operation 200 of reading each old byte OD not having to be replaced and a calculation 413, 425 of new parity bits NP associated with this destination memory word Wd on the basis of each new corresponding byte ND and of each old byte OD not having to be replaced; while if the old bytes OD of this destination memory word Wd must all be replaced with new bytes ND, the method of writing comprises a calculation of new parity bits NP associated with this destination memory word Wd on the basis of the new corresponding bytes ND without any prior operation 200 of reading the old bytes OD of this destination memory word Wd.

This makes it possible to implement at most two reading operations to carry out the writing of a string of new bytes, whatever the number of bytes in this string. In certain cases, a single or indeed no reading operation is necessary in this method.

Figure 4:
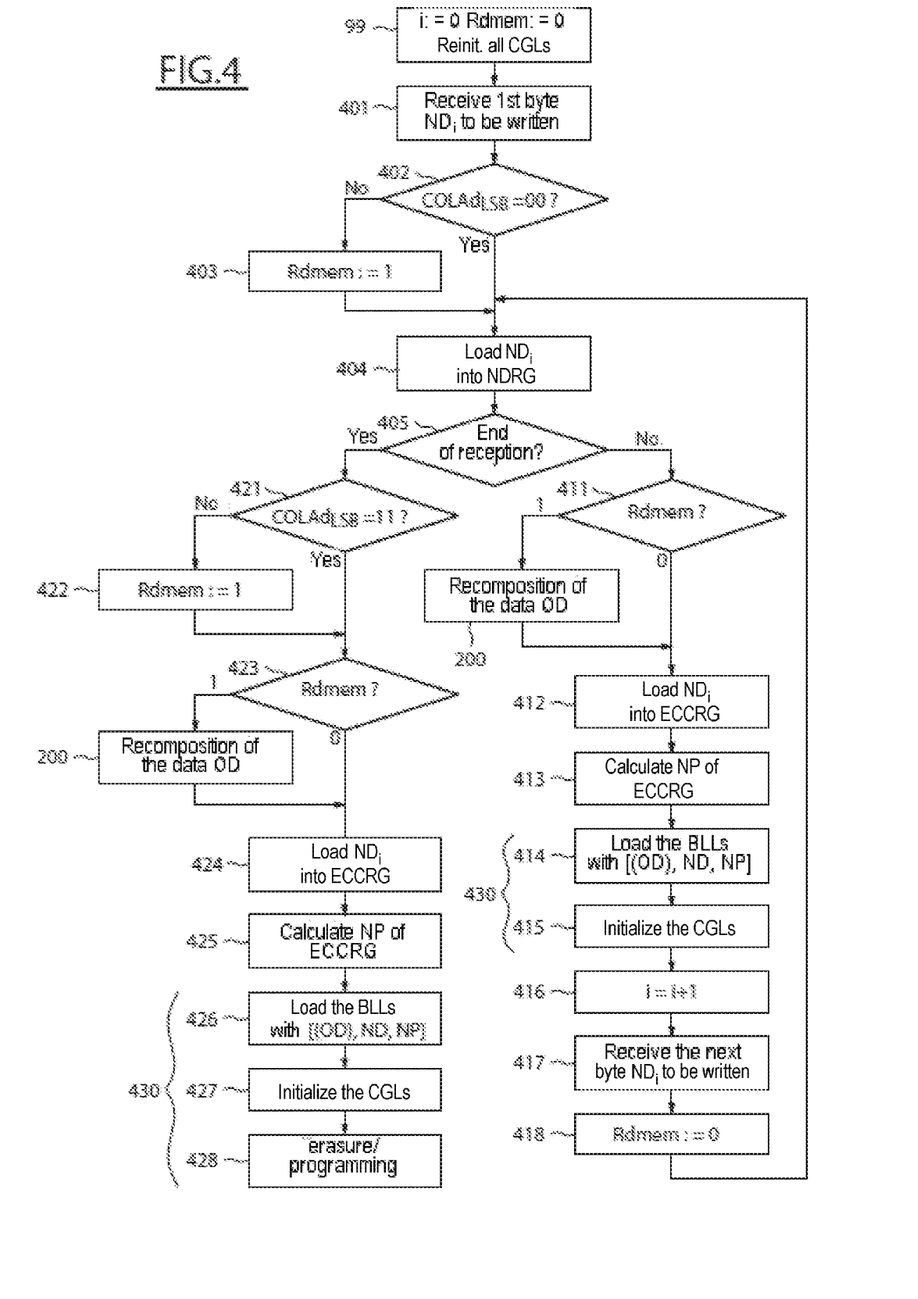

FIG. 4 is a chart representing a series of steps of such a method, according to an advantageous mode of implementation.

This mode of implementation is in particular suitable for a serial communication, for example, according to the I²C inter-integrated-circuit protocol or according to the SPI serial peripheral interface protocol.

A preliminary step 99 corresponds to initializations of internal variables (i:=0, Rdmem:=0) and to a reinitialization of all the control gate latches CGL.

In a starting step 401, for example, under the I²C protocol, the memory receives a start command, an identification, the address of the first byte to be written in the memory plane and the first byte to be written NDi (i=0).

A logical test 402 on an equality of the last two low-order bits of the address of the first byte to be written with the logical values 0-0 is carried out. A true result of this logical test (that is to say in the case where the last two low-order bits of the address of the first byte to be written each have a value equal to 0) is representative of a location of the first new byte to be written in the destination memory word Wd identical to the location of the first byte of the corresponding memory word Wd.

In the case of a false result of this logical test, it will be necessary to carry out a reading operation in the memory plane so as to calculate the new parity bits of the corresponding destination memory word, taking account at least of the first old byte of this destination memory word.

Thus, in case of false result of this logical test, an internal state variable Rdmem is initialized (403) to a given logical value (the value 1 in this example).

A starting initial condition 401 is to reinitialize the state variable Rdmem to the converse logical value (the value 0 in this example).

The state variable Rdmem makes it possible to verify (411, 423) for each destination memory word Wd whether or not the old bytes OD of this destination memory word Wd must all be replaced with new bytes ND.

After verification (402), the new byte NDi is loaded into an intermediate new-data register NDRG, during a preloading step 404. This intermediate new-data register NDRG has, for example, an architecture analogous to that of a memory word, except for the memory locations of the series of parity bits, and the new bytes are loaded therein at locations corresponding to those that they will have in the destination memory word.

The content of the intermediate new-data register NDRG will overwrite, if necessary, in the course of a next step (412, 424), up to three of the four bytes of another intermediate register ECCRG.

This other intermediate register ECCRG serves as input-output storage stage for the error correction logic, and as input for the bit line latches during the implementation of a cycle of writing in the memory plane. For example, the intermediate register ECCRG has an architecture analogous to that of a memory word and the new bytes are loaded therein at locations corresponding to those that they will have in the destination memory word.

Thereafter, a test 405 of end of reception is carried out. In the example of the I²C protocol, a stop signal is communicated to the memory when reception has terminated, after the communication of the last new byte to be written. As long as the stop signal is not communicated, another new byte to be written will be communicated to the memory.

If the stop signal is not communicated to the memory, then a test 411 on the logical value of the state variable Rdmem is carried out so as to know whether or not the old bytes of the destination memory word must be replaced by new bytes.

If the state variable Rdmem is set to o, the new bytes NDi loaded in the intermediate new-data register NDRG are loaded directly (412) into the intermediate register ECCRG.

Thereafter, the calculation 413 of the new parity bits NP is carried out on the basis of the new bytes loaded into the intermediate register ECCRG.

If the state variable Rdmem is set to 1, then the calculation 413 of the new parity bits NP must be carried out on the basis of the new bytes NDi and of the old bytes OD of the destination memory word Wd.

A recomposition of the data 200 is then implemented, similar to that described previously in conjunction with FIG. 2. This recomposition 200 makes it possible to load the old bytes useful in the calculation 413 of the new parity bits of the destination memory word into the intermediate register ECCRG.

It is recalled that the recomposition of the data 200 comprises a reading 201 of the destination memory word (in the memory plane or in the bit line latches BLL, as a function of the state of the corresponding control gate latch CGL) and a correction 202 of a possible error implemented by virtue of an error-correcting code mechanism. The old bytes OD thus read and possibly corrected are thereafter loaded 203 into the intermediate register ECCRG.

Next, the new bytes NDi of the intermediate new-data register NDRG are loaded 412 into the intermediate register ECCRG and overwrite the corresponding old bytes OD.

The new parity bits NP are calculated carried out on the basis of a combination of the new bytes NDi and of the old bytes OD and are loaded into the intermediate register ECCRG.

Thereafter, preliminary phases 414, 415 of the write cycle 430 are implemented.

The preliminary phases comprise a loading 414 of bit line latches BLL and an initialization 415 of a control gate latch CGL associated with the corresponding destination memory word Wd.

The bit line latches make it possible to store the data to be written physically in the memory plane PM, and the control gate latches CGL make it possible to indicate, when they are initialized, that the bit line latches corresponding to the associated memory word are already loaded. This makes it possible to direct a read towards the bit line latches BLL if the control gate latch CGL is initialized and thus to avoid a read in the memory plane.

This is useful in case of "rollover", that is to say when more data to be written is dispatched than the physical size of a page. In this case, the data exceeding the page size overwrite the initially dispatched data, that is to say that for a page of 256 bytes, only the last 256 bytes received are taken into account, the 257th received overwriting the first received, etc.

Hence, for the overwritten data, the possible recomposition must be done on the basis of the content of the bit line latches BLL, and no longer on the basis of the memory plane. It is the state of the control gate latch CGL which makes it possible to know whether a word Wd has already been loaded previously.

The following steps correspond to the reception of the new following byte. More precisely, these steps comprise incrementing 416 the address contained in an address register AREG, receiving the following byte, and reinitializing the state variable Rdmem to the value indicating that the bytes of the destination memory word will be replaced with new bytes. Thereafter, steps 404 to 418 are reproduced as long as the last byte has not been transmitted to the memory.

When the last new byte has been communicated during a step 417, a stop signal is communicated to the memory and writing conclusion steps 421-430 are implemented.

A logical test 421 on an equality of the last two low-order bits of the address of the last byte to be written with the logical values 1-1 is carried out. The address of the last new byte to be written is contained in the address register AREG, having been incremented in tandem with the successive receptions of the new bytes, from the address of the first new byte.

A true result of this logical test (that is to say in the case where the last two low-order bits of the address of the first byte to be written each have a value equal to 1) is representative of a location of the last new byte to be written in the corresponding destination memory word Wd identical to the location of the last byte of this memory word Wd.

If this is not the case, then a reading in the memory plane of this last destination memory word is necessary so as to calculate the parity bits associated with this destination memory word and the state variable Rdmem is initialized.

If the state variable Rdmem is set to 0, a calculation 425 of the new parity bits NP is carried out on the basis of the new bytes loaded in the intermediate register ECCRG.

If the state variable Rdmem is set to 1, then the calculation 425 of the new parity bits NP must be carried out on the basis of the new bytes and of the old bytes of the destination memory word, and a recomposition of the data 200 is implemented.

This is followed by preliminary loading phases 426, 427 homologous to steps 414 and 415.

All the bit line latches BLL having been loaded with the new bytes to be written, if appropriate, with the old bytes to be preserved, and with the new parity bits of the destination memory words, the write cycle 430 can then culminate with a physical writing 428 in the memory plane.

Writing 428 in the memory plane comprises in a customary manner the application of high-voltage erasure and programming pulses.

A memory configured to implement this type of advantageous method of writing is designed in such a manner as to be able to carry out the conclusion steps 421-430 after the end-of-reception stop signal.

For example, an internal clock can allow a controller to implement the conclusion steps, in a manner suitable for the I²C protocol. In another example, an automation can be dedicated to the implementation of the conclusion steps, in a manner suitable for the SPI protocol.

Figure 5:
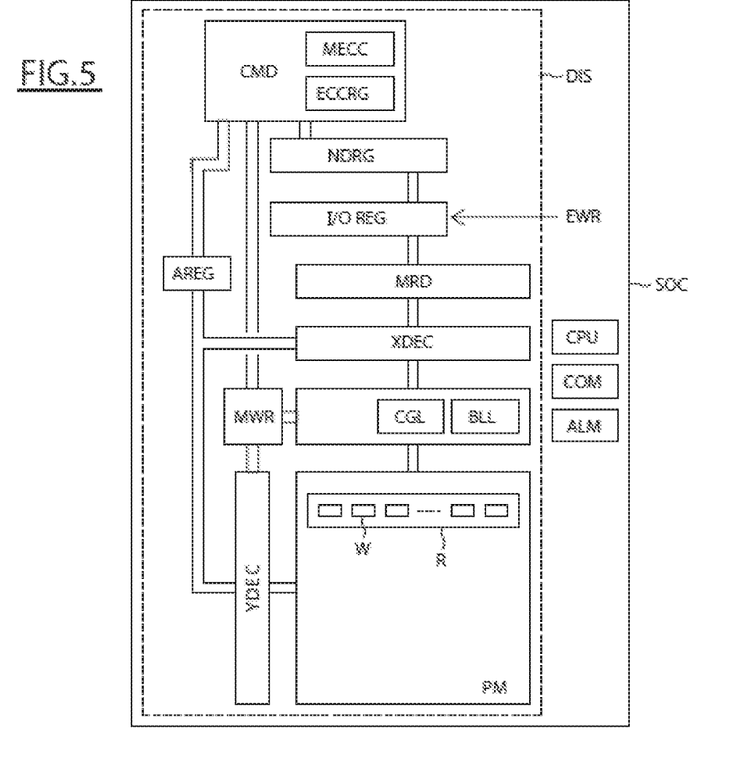

FIG. 5 represents a system on chip SOC comprising a memory device DIS able to verify whether or not the old bytes of a destination memory word must all be replaced with new bytes, and to carry out a reading operation only if necessary within the framework of an operation for writing a recomposition of old and of new data, and, in this example, within the framework of a calculation of new parity bits of such a recomposition.

Moreover the system on chip SOC comprises various modules intended to implement the function of this system on chip, such as a calculation and command module CPU, a communication interface module COM, or else a power supply module ALM.

The memory device comprises a memory plane PM, of conventional structure known per se, comprising memory cells of EEPROM type arranged in matrix fashion in rows R of memory words W and in columns.

An input EWR is intended to receive new data to be written, for example, transmitted by a user on an I²C bus interface.

It is recalled here that a memory cell of the EEPROM type comprises a transistor possessing in a conventional manner a control gate, a floating gate, a drain region and a source region. Such a cell is erasable and programmable through the Fowler-Nordheim effect.

A column decoder XDEC and a row decoder YDEC make it possible to address the memory plane PM and are themselves addressed by an address register AREG. The address register is configured to be incremented in tandem with the successive receptions of the new bytes to be written, from the address of the first new byte.

The memory device DIS also comprises read circuit MRD connected to the memory plane by the column decoder XDEC.

The write circuit MWR is linked to bit line latches BLL and to control gate latches CGL, and is able to implement write cycles by applying erasure and programming pulses in the memory cells via the row decoder YDEC.

The addresses and data can be input by respectively the address registers AREG and the write circuit MWR and the data can be extracted by the read circuit MRD.

These circuits are together commanded by a command logic, or state machine, CMD by way of an input-output register I/OREG.

An error-correcting code mechanism MECC and an intermediate register ECCRG which is useful in the calculation of the parity bits are included in the controller, in this example.

The controller CMD is moreover configured to furthermore be able to command the various circuits of the device after the end of the reception, in particular so as to implement the conclusion steps 421-430 described in conjunction with FIG. 4.

Figure 6:
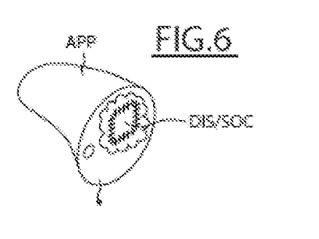

FIG. 6 represents an exemplary electronic apparatus APP, an auditory prosthesis in this representation, comprising such a memory device DIS, for example, embodied in integrated circuit form or included in a system on chip SOC for example.

Generally, the apparatus APP is an electronic apparatus having scant energy resources, such as apparatuses powered by cells or batteries, although the limiting of current consumption may be desirable in any other application.

Besides, the invention is not limited to these modes of implementation and embodiments but embraces all variants thereof, for example, additional steps, not detailed here, can be incorporated into the steps described in conjunction with FIG. 4, and likewise the memory device and the system on chip can integrate functions other than those which were presented in conjunction with FIGS. 5 and 6.

Furthermore, the invention has been described according to an application to a memory equipped with an error-correcting code mechanism, but adapts to suit a memory that does not have one, for example, by deleting steps 202, 413 and 425 of the method described in conjunction with FIG. 4. Likewise, the invention adapts to suit other values of granularities, for example, a first granularity of a bit, and a second granularity of a byte, by transposing byte with bit and memory word with byte in the present description.

What is claimed is:

1. A method of writing according to a first granularity in a memory plane of a non-volatile memory, the memory plane being arranged as memory words that each store more than one byte of data and the non-volatile memory being configured to access the memory plane according to a second granularity greater than the first granularity, the method comprising:
   receiving a string of new bytes to be written in the memory plane in a destination memory word that contains old bytes;
   verifying whether or not all the old bytes of the destination memory word must be replaced with new bytes;
   if not all old bytes must be replaced with a new byte, reading each old byte or bytes that do not need to be replaced and loading, into an intermediate register, the new bytes and the old byte or bytes that do not need to be replaced thereby forming a new content of the destination memory word;
   if all the old bytes must be replaced with new bytes, loading the new bytes into the intermediate register, thereby forming the new content of the destination memory word, without any prior operation of reading the old bytes of the destination memory word; and
   writing the new content of the destination memory word to the memory plane, and wherein in a mode of operation, the string of new bytes extends over a plurality of adjacent memory words, and reading each old byte or bytes that do not need to be replaced occurs only in a first and last memory word of the plurality of memory words.

2. The method according to claim 1, wherein the verifying comprises identifying a location of a first new byte to be written in the destination memory word and a location of a last new byte to be written in the destination memory word, wherein it is verified that the old bytes of the destination memory word must all be replaced with new bytes when locations assigned to the first byte of the destination memory word and assigned to the last byte of the destination memory word are the same.

3. The method according to claim 2, wherein identifying the location of the first new byte comprises performing a logical test between values of the last two low-order bits of an address of the location of the first new byte and the values 0-0, wherein equality between the values of the last two low-order bits and the values 0-0 signify that the location of the first new byte corresponds to the location assigned to the first byte of the destination memory word.

4. The method according to claim 2, wherein identifying the location of the last new byte comprises performing a logical test between the values of the last two low-order bits of the address of the location of the last new byte and the values 1-1, wherein equality between the values of the last two low-order bits and the values 1-1 signify that the location of the last new byte corresponds to the location assigned to the last byte of the destination memory word.

5. The method according to claim 1, wherein a series of parity bits is associated with each memory word of the memory plane, and wherein loading new bytes into the intermediate register comprises calculating a new parity bits associated with and based on the new content of the destination memory word.

6. The method according to claim 5, wherein calculating the new parity bits comprises calculating the new parity bits based on the new bytes and, if not all old bytes must be replaced with a new byte, the old bytes loaded in the intermediate register.

7. The method according to claim 5, wherein reading the old byte comprises correcting an error present in the old byte.

8. The method according to claim 1, wherein writing the new content comprises loading the bytes loaded in the intermediate register into corresponding bit line latches, and writing data loaded in the bit line latches to the memory plane.

9. The method according to claim 8, writing the new content further comprises writing new parity bits into the corresponding bit line latches, and writing the new parity bits loaded in the bit line latches to the memory plane.

10. The method according to claim 1, wherein the first granularity is one byte and the second granularity is one memory word.

11. The method according to claim 1, wherein the first granularity is one byte and the second granularity is four bytes.

12. A non-volatile memory device comprising:
an input coupled to receive data to be written according to a first granularity;
a memory plane arranged as memory words, each memory word to store more than one byte of data in memory locations;
a read circuit and a write circuit configured to carry out, according to a second granularity greater than the first granularity, reading operations and write cycles in the memory plane; and
a controller configured to, in the presence of a string of new bytes to be written in the memory plane in a destination memory word that already contains old bytes,
verify for the destination memory word whether or not the old bytes of the destination memory word must all be replaced with new bytes,
if not all old bytes must be replaced with a new byte, read each old byte or bytes that do not need to be replaced and load, into an intermediate register, the new byte or bytes and the old byte or bytes that do not need to be replaced thereby forming a new content of the destination memory word;
if all the old bytes must be replaced with new bytes, load the new bytes into the intermediate register, thereby forming the new content of the destination memory word, without any prior operation of reading the old bytes of the destination memory word; and
command the write circuit to carry out a cycle of writing the new content of the destination memory word, and wherein in a mode of operation, the string of new bytes extends over a plurality of adjacent memory words, and reading each old byte or bytes that do not need to be replaced occurs only in a first and last memory word of the plurality of memory words.

13. The device according to claim 12, wherein the controller is configured to, during the verification, identify respective locations of a first new byte to be written in the destination memory word and of a last new byte to be written in the destination memory word, wherein when locations assigned to the first byte of the destination memory word and assigned to the last byte of the destination memory word are identical, it is implied that the old bytes of the destination memory word must all be replaced with new bytes.

14. The device according to claim 13, wherein the controller is configured to carry out a logical test between values of the last two low-order bits of an address of the location of the first new byte and the values 0-0 so that equality between these values signifies that the location of this first new byte corresponds to that assigned to the first byte of the destination memory word, and to perform a logical test between the values of the last two low-order bits of the address of the location of the last new byte and the values 1-1 so that equality between these values signifies that the location of the last new byte corresponds to that assigned to the last byte of the destination memory word.

15. The device according to claim 12, wherein the memory plane comprises memory locations that store a series of parity bits associated with each memory word, the device further comprising an error correction circuit configured to calculate new parity bits associated with and based on new content of each destination memory word.

16. The device according to claim 15, wherein the read circuit is configured to carry out reading operations to read the old bytes in the memory plane and the error correction circuit to correct a possible error present in the memory words read.

17. The device according to claim 12, wherein the controller is configured to further command the read circuit and the write circuit, after receiving the last byte of the string of new bytes to be written.

18. The device according to claim 12, wherein the write circuit is configured to, during a write cycle, load the new content of the destination memory word loaded in the intermediate register in bit line latches, and to write in the memory plane the data loaded in the bit line latches.

19. The device according to claim 12, wherein the first granularity is one byte and the second granularity is one memory word.

20. A system on a chip device comprising:
a processor;
a communication interface coupled to the processor;
a memory plane coupled to receive data to be written according to a first granularity from the processor, the memory plane arranged as memory words, each memory word to store more than one byte of data in memory locations;
a read circuit and a write circuit configured to carry out, according to a second granularity greater than the first granularity, reading operations and write cycles in the memory plane; and
a controller configured to, in the presence of a string of new bytes to be written in the memory plane in a destination memory word that already contains old bytes,
verify for the destination memory word whether or not the old bytes of the destination memory word must all be replaced with new bytes,
if not all old bytes must be replaced with a new byte, read each old byte or bytes that do not need to be replaced and load, into an intermediate register, the new byte or bytes and the old byte or bytes that do not need to be replaced thereby forming a new content of the destination memory word;
if all the old bytes must be replaced with new bytes, load the new bytes into the intermediate register, thereby forming the new content of the destination memory word, without any prior operation of reading the old bytes of the destination memory word; and command the write circuit to carry out a cycle of writing the new content of the destination memory word;

wherein the processor, the communication interface, the memory plane, the read circuit, the write circuit, and the controller are integrated in a single semiconductor chip, and wherein in a mode of operation, the string of new bytes extends over a plurality of adjacent memory words, and reading each old byte or bytes that do not need to be replaced occurs only in a first and last memory word of the plurality of memory words.

21. The device according to claim 20, wherein the device is part of an auditory prosthesis.

22. The device according to claim 20, wherein the device is part of a mobile telephone.

* * * * *